United States Patent
Aoki et al.

(10) Patent No.: US 8,124,171 B2
(45) Date of Patent: Feb. 28, 2012

(54) METHOD OF AND APPARATUS FOR MANUFACTURING TAPE-FORMED OXIDE SUPERCONDUCTOR

(75) Inventors: Yuji Aoki, Tokyo (JP); Hiroshi Fuji, Tokyo (JP); Sukeharu Nomoto, Tokyo (JP); Ryo Teranishi, Tokyo (JP); Teruo Izumi, Tokyo (JP); Yuh Shiohara, Tokyo (JP)

(73) Assignees: International Superconductivity Technology Center, The Juridical Foundation, Tokyo (JP); SWCC Showa Cable Systems Co., Ltd., Tokyo (JP)

(*) Notice: Subject to any disclaimer, the term of this patent is extended or adjusted under 35 U.S.C. 154(b) by 1132 days.

(21) Appl. No.: 11/385,742

(22) Filed: Mar. 22, 2006

(65) Prior Publication Data
US 2006/0216407 A1    Sep. 28, 2006

(30) Foreign Application Priority Data
Mar. 25, 2005    (JP) .................................. 2005-088798

(51) Int. Cl.
  *B05D 5/12* (2006.01)
  *H01L 39/24* (2006.01)
(52) U.S. Cl. ............ 427/62; 29/599; 505/434; 505/473; 505/730; 505/740; 505/741
(58) Field of Classification Search .................... 427/62; 29/599; 505/434, 473, 730, 740, 741
See application file for complete search history.

(56) References Cited

U.S. PATENT DOCUMENTS

| | | | | |
|---|---|---|---|---|
| 4,962,085 A | * | 10/1990 | deBarbadillo et al. | 505/500 |
| 5,017,550 A | * | 5/1991 | Shioya et al. | 505/434 |
| 5,034,372 A | * | 7/1991 | Matsuno et al. | 505/447 |
| 5,908,507 A | | 6/1999 | Onabe et al. | 118/718 |
| 2003/0127051 A1 | | 7/2003 | Fritzemeier et al. | 118/715 |
| 2005/0065035 A1 | * | 3/2005 | Rupich et al. | 505/300 |

FOREIGN PATENT DOCUMENTS

| | | |
|---|---|---|
| JP | 02-208209 | 8/1990 |
| JP | 11-120842 | * 4/1999 |
| JP | 11-329116 | 11/1999 |
| JP | 2003-121076 | 4/2003 |

OTHER PUBLICATIONS

Lee, F.D. et al "Reel-to-Reel Ex Situ Conversion of High Critical Current Density Electron-Beam Co-evaporated $BaF_2$ Precursor on RABiTS", *Superconductor Science and Technology*, vol. 17, No. 3, Mar. 1, 2004, pp. 386-394.

(Continued)

*Primary Examiner* — Brian K Talbot
(74) *Attorney, Agent, or Firm* — Bacon & Thomas, PLLC

(57) ABSTRACT

A method of manufacturing a tape-formed oxide superconductor, in which a tape-formed wire material (6 in FIG. 1) is extended between a pair of reels (5a and 5b). Besides, a reactive gas is supplied form the gas supply ports of a reactive gas supply pipe (3a) vertically to the upper side film surface of the tape-formed wire material (6), so as to react the film body of this tape-formed wire material into a superconducting layer, while at the same time, a gas after the reaction is discharged from the gas discharge ports of discharge pipes (4a and 4b) for discharging the gas after the reaction. Likewise, the reactive gas is supplied vertically to the lower side film surface of the tape-formed wire material (6), so as to react the film body of this tape-formed wire material into a superconducting layer, while at the same time, the gas after the reaction is discharged from the gas discharge ports of discharge pipes (4c and 4d) for discharging the gas after the reaction. Even when the tape-formed wire material (6) is large in area, the tape-formed oxide superconductor has superconducting characteristics being uniform in it widthwise direction, and it can be manufactured at high speed.

5 Claims, 4 Drawing Sheets

OTHER PUBLICATIONS

Nomoto, S. et al, "Development of Wide Area Reaction System for Reel-to-Reel TFA-MOD Process", 18th International Symposium on Superconductivity, Oct. 24-25, 2005, Tsukuba, Japan *Physica C.*, vol. 445-448, Oct. 1, 2006, pp. 549-552.

* cited by examiner

METHOD OF AND APPARATUS FOR MANUFACTURING TAPE-FORMED OXIDE SUPERCONDUCTOR

CROSS-REFERENCE TO RELATED APPLICATIONS

Japanese Patent Application No. 2005-088798 filed Mar. 25, 2005

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISK

Not Applicable

BACKGROUND OF THE INVENTION

1. Field of the Invention

The present invention relates to improvements in a method of and an apparatus for manufacturing a tape-formed oxide superconductor.

2. Description of Related Art

Heretofore, as a method of manufacturing a tape-formed oxide superconductor of YBCO type (Y—Ba—Cu—O) suitable for applications to superconducting magnets, superconducting cables, and electric power machines and instruments, there has been known one based on organometallic salt coating and thermodecomposition (or MOD short for metal organic deposition) capable of manufacturing the tape-formed oxide superconductor by a non-vacuum process.

With this method, a superconducting layer is formed in such a way that an intermediate layer is formed on a substrate, that the substrate bearing the intermediate layer is coated with that mixed solution of trifluoroacetate salt (TFA salt) or the like metalorganic acid salt such as octylic acid salt or naphthenic acid salt in which individual metal elements constituting the superconductor are contained at predetermined mol ratios, and that the resulting substrate is calcined, followed by a heat treatment.

In order to make such a tape-formed oxide superconductor elongate, a tubular furnace is employed as a treatment furnace. Heretofore, an atmosphere in the furnace has been controlled by causing an atmosphere gas (reactive gas) to flow from one end to the other end of a furnace core tube. It has been known that, when the gas is caused to flow to the elongate material in the axial direction of the furnace core tube in this manner, the atmosphere changes in the axial direction of the furnace core tube under the influence of a gas which is generated from the elongate material during a reaction, so the elongate material becomes very difficult of being uniformly reacted.

Especially in a method (TFA-MOD method) wherein a YBCO film is formed in such a way that the film of a preform obtained by the calcination of the above TFA salt and containing F (ex-situ method) is formed on a tape surface, and that it is thereafter heat-treated, HF is generated during the calcination and the heat treatment for the reasons that the element F is contained in the preform film and that water vapor is used during the heat treatment. This poses the problem that superconducting characteristics degrade under the influence of HF gas generated after the reaction.

For the purpose of suppressing the influence of the gas after the reaction and holding the atmosphere in the furnace constant in order to avoid such a problem, the reactive gas needs to flow along the tape surface in a direction vertical to the axial direction of the furnace core tube.

As an atmosphere control type heat treatment furnace wherein the reactive gas is caused to flow along the tape surface in the direction vertical to the axial direction of the furnace core tube, there has been known one in which a plurality of gas flow passages are formed by a furnace core tube that is configured of an outer tube and an inner tube arranged concentrically, and partition plates that divides a cylindrical space defined by the outer tube and the inner tube, into a plurality of parts within a section vertical to the axial direction of the furnace core tube, and in which pluralities of gas outflow ports and gas inflow ports are respectively provided at substantially the opposing positions of the inner tube in the plurality of gas flow passages (refer to Patent Document 1).

Patent Document 1: JP-A-2003-121076 (page 2, right column, lines 24-31 and lines 37-41, and FIGS. 1-4)

In the atmosphere control type heat treatment furnace wherein the reactive gas is caused to flow along the tape surface in the direction vertical to the axial direction of the furnace core tube, the homogeneous gas is supplied at different flow velocities to the gas flow passages having the pluralities of gas outflow ports and gas inflow ports, whereby a pressure difference can be established between the gas outflow ports and the gas inflow ports, and the reactive gas can be caused to uniformly flow along the tape surface in the direction vertical to the axial direction of the furnace core tube.

Regarding the above method, however, the following fact has been revealed: When a tape-formed wire material in which a film body being a superconductor preform is formed on a substrate of large area (large width) is caused to continuously travel in the furnace, so as to react the film body into a superconducting layer, the growth rate of a crystal differs in the widthwise direction of the tape. More specifically, the crystal growth rate on the discharge side of a gas after the reaction becomes much lower as compared with that on the supply side of the reactive gas. It is accordingly difficult to form a superconducting layer which as uniform characteristics in the widthwise direction of the surface of the substrate.

There has consequently been the problem that a tape-formed oxide superconductor of large area (large width) is difficult of being obtained.

BRIEF SUMMARY OF THE INVENTION

The present invention has been made in order to solve the above problem, and it has for its object to provide a manufacturing method which can quickly manufacture a tape-formed oxide superconductor of large area (large width) having uniform superconducting characteristics in the widthwise direction thereof, and an apparatus which is suited to the manufacturing method.

In order to accomplish the object, a method of manufacturing a tape-formed oxide superconductor according to the invention consists in comprising the steps of causing a tape-formed wire material in which a film body being a superconductor preform is formed on a surface of a tape-formed substrate, to continuously travel in a heating zone; and supplying a reactive gas vertically to a film surface of the film body in the heating zone, and simultaneously discharging a gas after a reaction from both sides of the film surface along the film surface, thereby to react and crystallize the film body into a superconducting layer.

In this case, it is preferable that the reactive gas is supplied from a plurality of places along a traveling direction of the tape-formed wire material, while the gas after the reaction is discharged from a plurality of places on both sides along the film surfaces in correspondence with the supply of the reactive gas.

Besides, in the above case, it is preferable that the reactive gas is supplied from the plurality of places in correspondence with a widthwise direction of the film surface.

Besides, in order to simultaneously achieve the enlarge area of the tape-formed oxide superconductor and the heightened speed of the manufacture, the tape-formed wire material can be extended between a pair of reels disposed within the heating zone, so that the tape-formed substrate may lie in touch with the reels by at least one turn, and the reactive gas can be supplied vertically to the respective film surfaces traveling between the reels.

In this case, the reactive gas is supplied to the respective film surfaces of the tape-formed wire material which is extended and inverted between the reels, and the gas after the reaction is discharged from both the sides of the film surfaces along these film surfaces. As in the foregoing, it is preferable that the reactive gas is supplied from a plurality of places along the traveling direction of the tape-formed wire material, while the gas after the reaction is discharged from a plurality of places on both the sides along the film surfaces in correspondence with the supply of the reactive gas, and that the reactive gas is supplied from pluralities of places in correspondence with the widthwise directions of the film surfaces.

The above method of manufacturing a tape-formed oxide superconductor is well suited for application to a case where the film body of the superconductor preform on the surface of the tape-shaped substrate has been formed by coating the tape-formed substrate with a mixture of a metalorganic acid salt containing elements which constitute an RE123-type superconductor (where "RE" denotes at least one element selected from the group consisting of La, Nd, Sm, Eu, Gd, Dy, Ho, Er, Tm, Yb, Lu and Y, and thereafter calcining the resulting substrate.

Further, in order to accomplish the object, an apparatus for manufacturing a tape-formed oxide superconductor according to the invention consists in an apparatus for manufacturing a superconductor by heating an reacting a tape-formed wire material in which a film body being a superconductor preform is formed on a surface of a tape-formed substrate; an apparatus for manufacturing a tape-formed oxide superconductor, comprising (a) a tubular furnace in which the tape-formed wire material travels continuously; (b) a gas supply port which serves to supply a reactive gas vertically to a film surface of the film body in the tubular furnace; and (c) gas discharge ports which serve to discharge a gas after the reaction, from both sides of the film surface along the film surface.

In the above apparatus, it is preferable to provide the gas supply ports in a plurality of places along a traveling path of the tape-formed wire material, and to provide the gas discharge ports in a plurality of places on both sides in correspondence with the gas supply ports. In this case, it is preferable to provide the gas supply ports in a plurality of places in correspondence with a widthwise direction of the film surface.

Besides, the object of the invention concerns an apparatus for manufacturing a superconductor by heating and reacting a tape-formed wire material in which a film body being a superconductor preform is formed on a surface of a tape-formed substrate; an apparatus for manufacturing a tape-formed oxide superconductor, and it can be accomplished by an apparatus for manufacturing a tape-formed oxide superconductor, comprising (a) a tubular furnace in which the tape-formed wire material travels continuously; (b) a pair of reels which are disposed within the tubular furnace in order to extend the tape-formed wire material therebetween; (c) a plurality of gas supply ports which are provided along a traveling direction of the tape-formed wire material in order to supply a reactive gas vertically to film surfaces of the respective film bodies of the tape-formed wire material extended and traveling between the pair of reels; and (d) a plurality of gas discharge ports which are provided on both sides along the film surfaces in order to discharge a gas after the reaction, from over the film surfaces in correspondence with the gas supply ports.

In the above apparatus, it is preferable to provide the gas supply ports in pluralities of places in correspondence with a widthwise directions of the film surfaces.

According to the invention, a tape-formed oxide superconductor in which the growth rate of the crystal of a superconducting layer is uniform over the widthwise direction of a tape can be manufactured, and a tape-formed oxide superconductor of large area and elongate shape as is at least 30 mm can be manufactured at high speed by organometallic salt coating and thermodecomposition (MOD). Therefore, the invention is greatly valuable in practical use.

DETAILED DESCRIPTION OF THE INVENTION

Figure 1:
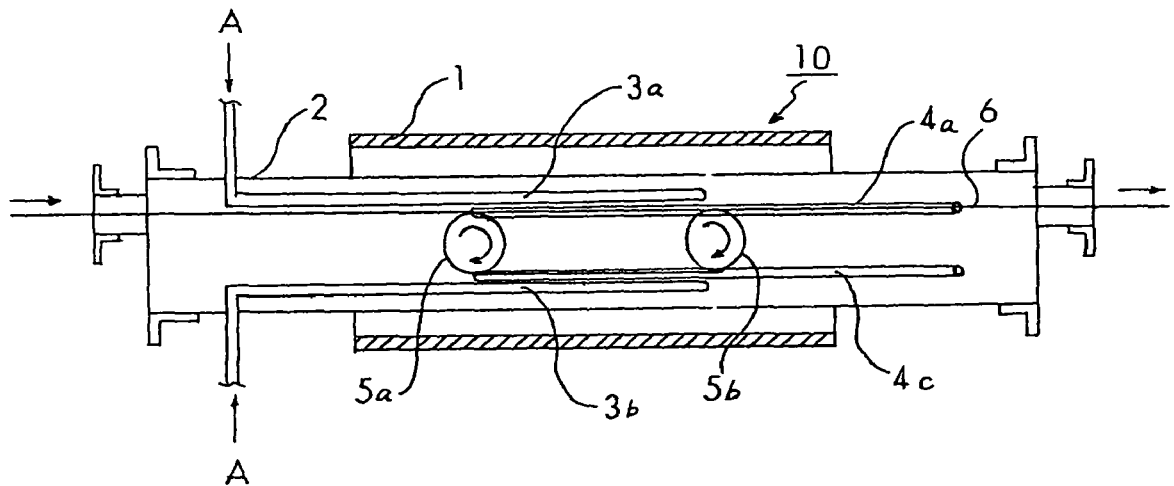
FIG. 1 is a schematic vertical sectional view containing the axial direction of a furnace core tube, showing an embodiment of an apparatus for manufacturing a tape-formed oxide superconductor according to the present invention.
Figure 2:
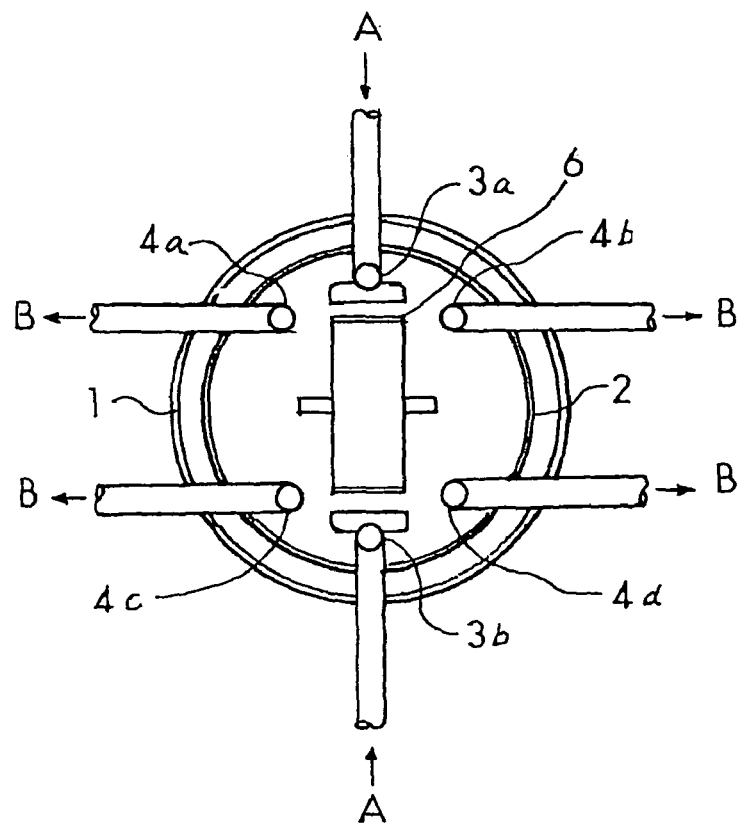
FIG. 2 is a sectional view taken perpendicularly to the axial direction of the furnace core tube of the apparatus for manufacturing a tape-formed oxide superconductor as shown in FIG. 1.

FIG. 1 is a schematic vertical sectional view containing the axial direction of a furnace core tube, showing an embodiment of an apparatus 10 for manufacturing a tape-formed oxide superconductor according to the present invention, while FIG. 2 is a sectional view taken perpendicularly to the axial direction of the furnace core tube. How, the embodiment will be described with reference to FIGS. 1 and 2.

Referring to FIGS. 1 and 2, numeral 1 designates a cylindrical heater, numeral 2 designates a tubular furnace which is disposed concentrically with the heater 1, signs 3*a* and 3*b* designates reactive gas supply pipes which are respectively disposed at the upper and lower parts of the interior of the tubular furnace 2, signs 4*a*, 4*b*, 4*c* and 4*d* designate discharge pipes for a gas after a reaction as are respectively disposed inside the tubular furnace 2, and signs 5*a* and 5*b* designate a pair of reels which are respectively disposed inside the tubular furnace 2.

The heater 1 is disposed at the axial middle part of the tubular furnace 2 outside this tubular furnace 2, and the pair of reels 5*a* and 5*b* are disposed so as to lie at the axial middle part of the heater 1.

The reactive gas supply pipe 3*a* is disposed with its gas supply ports located over an upper side film surface, in order to supply a reactive gas from a vertical direction to the upper side film surface of the tape-formed wire material 6 which is extended between the pair of reels 5*a* and 5*b*. On the other hand, the reactive gas supply pipe 3*b* is disposed with its gas supply ports located under a lower side film surface, in order to supply the reactive gas from a vertical direction to the lower side film surface of the tape-formed wire material 6 which is extended between the pair of reels 5*a* and 5*b*.

The discharge pipes 4*a* and 4*b* for discharging the gas after the reaction are disposed with their gas discharge ports located along both the sides of the upper side film surface, in order that the gas after the reaction may be discharged from both the sides along the upper side film surface of the tape-formed wire material 6 which is extended between the pair of reels 5*a* and 5*b*. On the other hand, the discharge pipes 4*c* and 4*d* for discharging the gas after the reaction are disposed with their gas discharge ports located along both the sides of the lower side film surface, in order that the gas after the reaction may be discharged from both the sides along the lower side film surface of the tape-formed wire material 6 which is extended between the pair of reels 5*a* and 5*b*.

In such an apparatus, the tape-formed wire material 6, in which a film body being a superconductor preform is formed on the surface of a tape-formed substrate, is supplied into the tubular furnace 2 from the left side as viewed in FIG. 1, and it is extended between the pair of reels 5*a* and 5*b*, whereupon it is delivered from the right side. In this case, the tape-formed wire material 6 can also be extended and caused to travel between the pair of reels 5*a* and 5*b* a plurality of times, so as to be subjected to a heat treatment.

The tape-formed wire material 6 extended between the pair of reels 5*a* and 5*b* has its upper side film surface supplied with the reactive gas vertically from the gas supply ports of the reactive gas supply pipe 3*a*, and it has its film body reacted with the reactive gas into a superconducting layer, while at the same time, the gas after the reaction is discharged from the gas discharge ports of the discharge pipes 4*a* and 4*b* for discharging this gas after the reaction. Likewise, the tape-formed wire material 6 extended between the pair of reels 5*a* and 5*b* has its lower side film surface supplied with the reactive gas vertically from the gas supply ports of the reactive gas supply pipe 3*b*, and it has its film body reacted with the reactive gas into a superconducting layer, while at the same time, the gas after the reaction is discharged from the gas discharge ports of the discharge pipes 4*c* and 4*d* for discharging this gas after the reaction.

Figure 3:
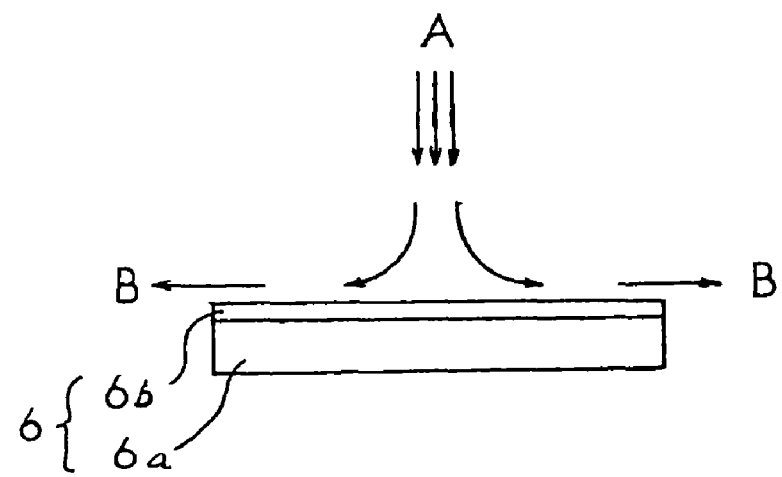
FIG. 3 is a model diagram showing the supply of a reactive gas (A) and the discharge directions of a gas after a reaction (B), in a method of manufacturing a tape-formed oxide superconductor according to the invention.

FIG. 3 shows the supply of the reactive gas (A) and the discharge directions of the gas after the reaction (B), in model-like fashion. The reactive gas (A) is vertically supplied to the film surface of the film body 6*b* of the traveling tape-formed wire material 6 in which this film body 6*b* being the superconductor preform is formed on the surface of the tape-formed substrate 6*a*, while the gas after the reaction (B) is discharged from both the sides of the film surface along this film surface.

Figure 4:
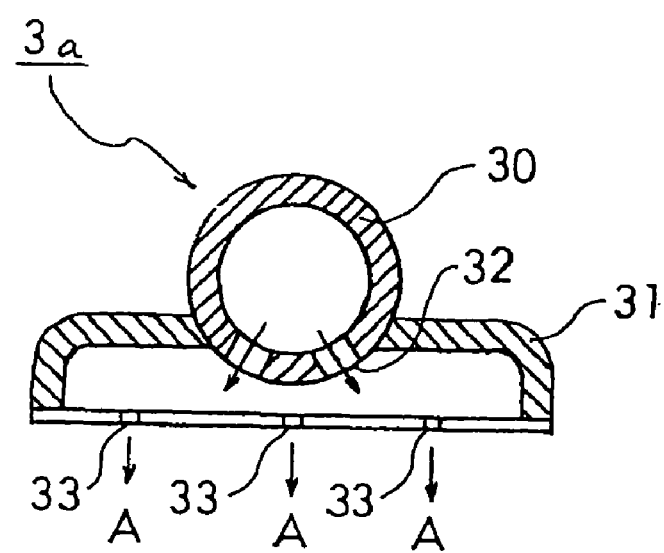
FIG. 4 is a sectional view of a reactive gas supply pipe 3a for use in the apparatus for manufacturing a tape-formed oxide superconductor according to the present invention.

FIG. 4 shows the cross section of the reactive gas supply pipe 3*a*. The reactive gas supply pipe 3*a* has such a shape that a rectangular pipe 31 is coupled to the lower part of a cylindrical pipe 30. Two openings 32 for emitting the gas from the cylindrical pipe 30 into the rectangular pipe 31 are provided at an angle of 60 degrees with respect to the center axis of the cylindrical pipe 30. Besides, the openings 32 are provided in only one place of the right end of the reactive gas supply pipe 3*a* as viewed in FIG. 1. The rectangular pipe 31 is provided with the three gas supply ports 33 at predetermined intervals, and these gas supply ports 33 are provided in a large number at predetermined intervals along the axial direction of the reactive gas supply pipe 3*a*.

The reactive gas is emitted from the cylindrical pipe 30 into the rectangular pipe 31 through the openings 32, and it is vertically supplied from the large number of gas supply ports 33 to the tape-formed wire material 6 while advancing in the reverse direction to the traveling direction of this tape-formed wire material 6 and being heated. Also the reactive gas supply pipe 3*b* has the same structure as that of the reactive gas supply pipe 3*a*.

Embodiment

In the apparatus 10 for manufacturing a tape-formed oxide superconductor as shown in FIGS. 1 and 2, and the reactive gas supply pipes 3*a* and 3*b* shown in FIG. 4, a manufacturing apparatus 10 was configured of a cylindrical heater 1 which had a length of 1000 nm, a tubular furnace 2 which had a length of 1460 mm and an inside diameter of 216 mm, reactive gas supply pipes 3*a* and 3*b* each of which was constituted by a cylindrical pipe 30 having an inside diameter of 12.5 mm and a rectangular pipe 31 having an inner width of 36.5 mm, discharge pipes 4*a*, 4*b*, 4*c* and 4*d* for discharging the gas after the reaction, each of which had an inside diameter of 12.5 mm, and a pair of reels 5*a* and 5*b* which had an interaxial distance of 400 mm and each of which had an outside diameter of 100 mm.

Incidentally, the reactive gas supply pipes 3*a* and 3*b* were formed under the conditions that the diameter of each opening 32 was 6 mm, that the diameter of each gas supply port 33 was 0.35 mm, that the intervals of the gas supply ports 33 in the widthwise direction of the rectangular pipe 31 were 13 mm, that the distribution length of the gas supply ports 33 in the lengthwise direction of the rectangular pipe 31 was 300 mm, and that the intervals of the gas supply ports 33 in the axial direction of each reactive gas supply pipe were 2 mm.

(Preparation of Tape-Formed Wire Material)

A tape-formed wire material was manufactured as stated below. There was prepared that mixed solution of a trifluoracetate salt (TFA salt) in which individual metal elements constituting a YBCO-type (123) superconductor were contained at predetermined mol ratios, and the surface of a tape-formed substrate was coated with the mixed solution by spin coating. Thereafter, the resulting substrate was calcined while a mixed gas in which oxygen and water vapor were contained in argon gas was being supplied at low temperatures of and below 400° C., whereby the film body of a superconductor preform having a thickness of 2.0 μm was formed on the substrate surface.

(Crystal Growth Rate Based on Parallel Flow Gas)

Film bodies being superconductor preforms were reacted into superconducting layers by employing tape-formed wire materials which had widths of 10-30 mm, and in a furnace which was held at temperatures of 725-800° C., in such a way that a mixed gas in which oxygen and water vapor were contained in argon gas was supplied from one side along the film surface of each film body, and that the gas after the reaction was discharged from the other side.

Figure 5:
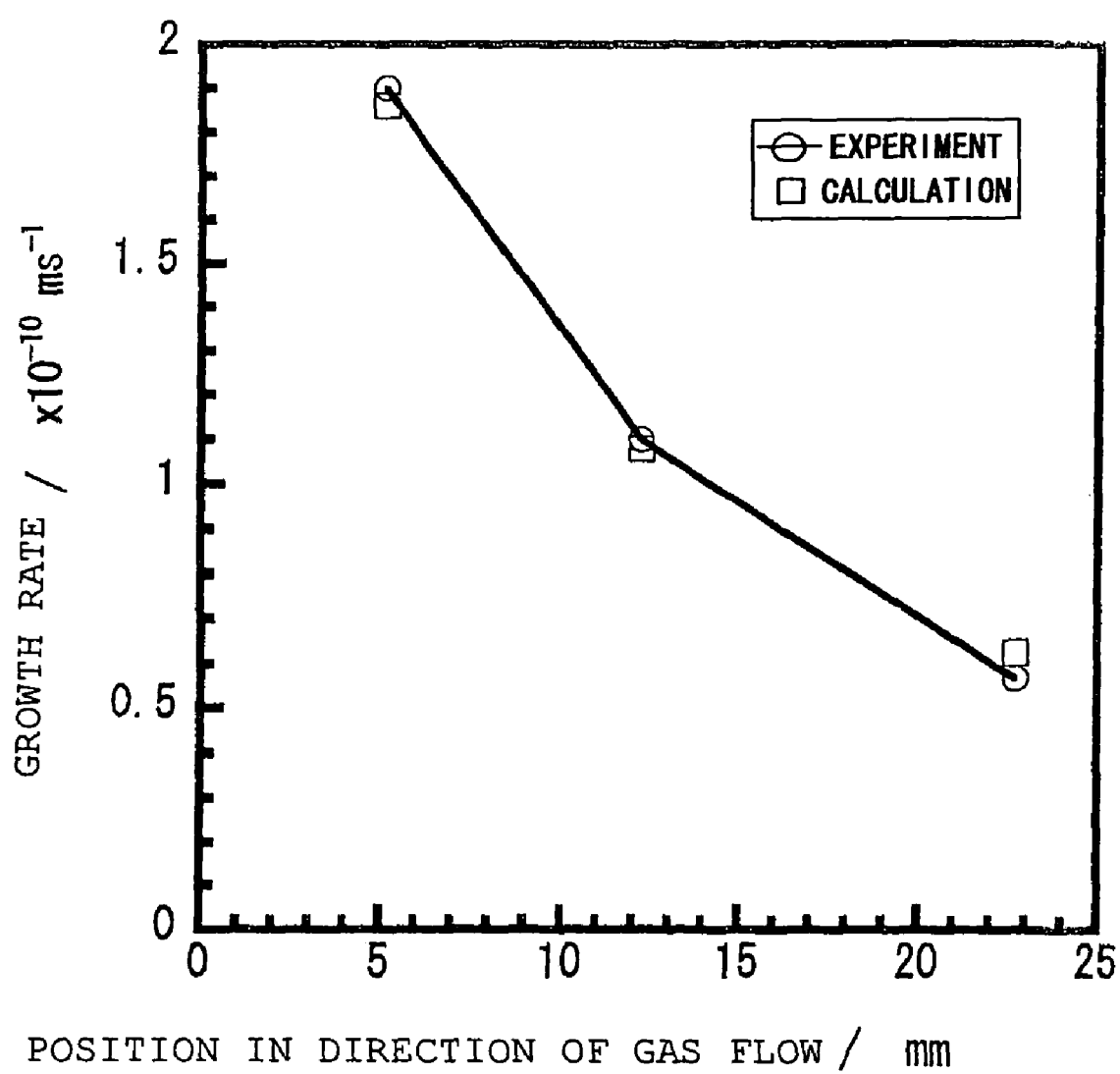
FIG. 5 is a graph showing the relationship between the widthwise position of a superconducting layer and the growth rate of the crystal of the superconducting layer as based on a parallel flow scheme in the prior art.

FIG. 5 shows the relationship thus obtained between the growth rate of the crystal of the superconducting layer formed on the surface of the tape-formed substrate and a distance from one end of the tape-formed substrate. Besides, in the figure, the growth rate of the crystal as is calculated under the same conditions is simultaneously shown.

As seen from the figure, when the width of the substrate becomes large relative to a parallel flow, the growth rate of the crystal decreases drastically. That is, the growth rate of the crystal on the discharge side of the gas after the reaction becomes much lower as compared with that of the crystal on the supply side of the reactive gas, and it becomes difficult to form a superconducting layer which has uniform characteristics in the widthwise direction of the substrate.

Example 1

Using the apparatus 10 for manufacturing a tape-formed oxide superconductor as shown in FIGS. 1 and 2, a film body being a superconductor preform was reacted into a superconducting layer in such a way that a tape-formed wire material in which the film body being the superconductor preform was formed on the surface of a tape-formed substrate having a width of 30 mm was caused to continuously travel at a speed of 0.26 m/h in the tubular furnace 2 which was held at temperatures of 725-800° C., and that a mixed gas in which oxygen and water vapor were contained in argon gas was vertically supplied to the film surface of the film body by a 3-nozzle scheme, while the gas after the reaction was discharged from both the sides of the film surface along this film surface.

Figure 6:
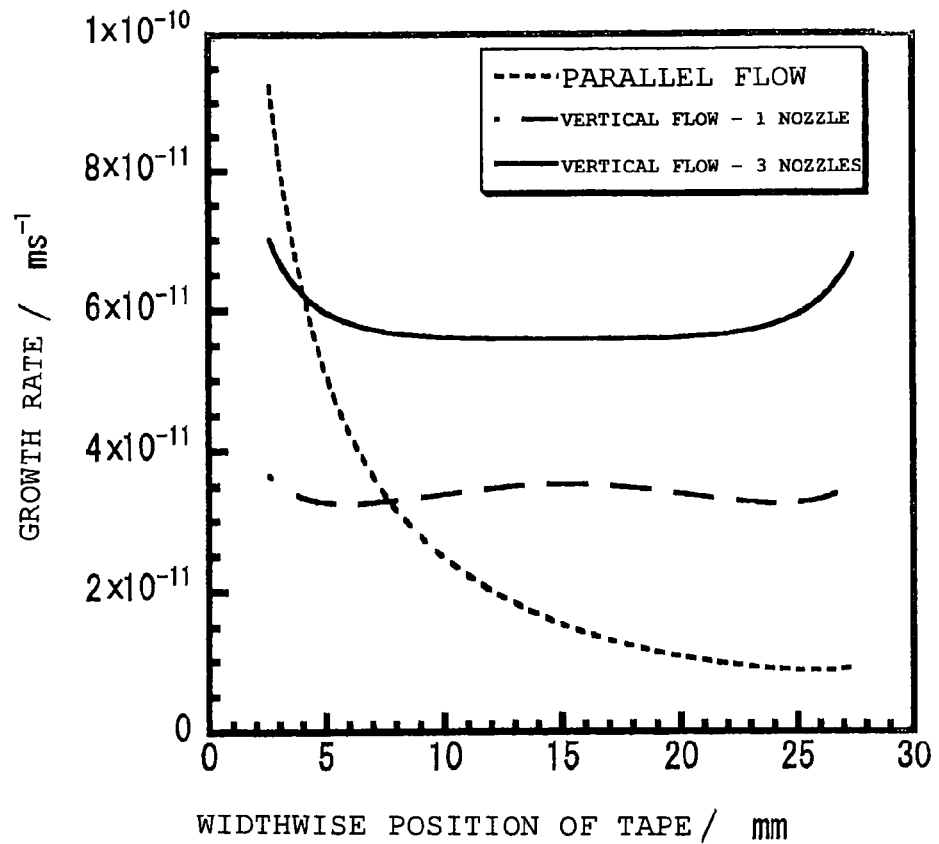
FIG. 6 is a graph showing the relationships between the widthwise positions of superconductor layers formed on substrates and the growth rates of the crystals of the superconductor layers, these superconductor layers having been manufactured by methods of manufacturing a tape-formed oxide superconductor according to examples of the invention and a comparative example.

FIG. 6 shows the relationship thus obtained between the widthwise position of the superconducting layer and the growth rate of the crystal of the superconducting layer.

Example 2

A tape-formed wire material in which a film body being a superconductor preform was formed on the surface of a substrate was caused to continuously travel in the tubular furnace, by the same method as in Example 1. The film body being the superconductor preform was reacted into a superconducting layer in such a way that a mixed gas in which oxygen and water vapor were contained in argon gas was vertically supplied to the central part of the film surface of the film body in the tubular furnace by a 1-nozzle scheme, while the gas after the reaction was discharged from both the sides of the film surface along this film surface. In this case, as the reactive gas supply pipes 3a and 3b in FIG. 4, ones whose rectangular pipes 31 were provided with the gas supply ports 33 in only central parts were used.

The relationship thus obtained between the widthwise position of the superconducting layer and the growth rate of the crystal of the superconducting layer is also shown in FIG. 6.

Comparative Example

A tape-formed wire material in which a film body being a superconductor preform was formed on the surface of a substrate was caused to continuously travel in the tubular furnace, by the same method as in Example 1. A reactive gas was supplied from a gas supply port provided on one side along the film surface of the film body in the tubular furnace, while a gas after the reaction was discharged from a gas discharge port provided on the opposite side along the film surface.

The relationship thus obtained between the widthwise position of the superconducting layer and the growth rate of the crystal of the superconducting layer is also shown in FIG. 6.

The shown results of Examples 1 and 2 and the comparative example reveal the following: With the method based on the parallel flow gas in the comparative example, there is demonstrated a tendency in which the growth rate of the crystal lowers drastically from the supply side of the supply gas toward the discharge side of the gas after the reaction and becomes nonuniform, for the reason that the concentration of a discharge substance after the reaction becomes higher from the supply side of the reactive gas toward the discharge side of the gas after the reaction, in the widthwise direction of tape. In contrast, with that 1-nozzle scheme of Example 2 in which the gas supply ports 33 are provided in the central parts, the growth rate of the crystal is uniform over the widthwise direction of the superconducting layer. Besides, with that 3-nozzle scheme of Example 1 in which the gas supply ports 33 are provided in the central parts and on both the sides thereof, not only the growth rate of the crystal is uniform over the widthwise direction of the superconducting layer, but also the growth rate of the crystal is entirely much better than that with the 1-nozzle scheme.

Example 3

A film body being a superconductor preform was reacted into a superconducting layer by the same method as in Example 1, except that a tape-formed wire material in which the film body was formed on the surface of a tape-formed substrate having a width of 10 mm was employed, and that the tape-formed wire material was extended between the pair of reels 5a and 5b by 3 turns.

Figure 7:
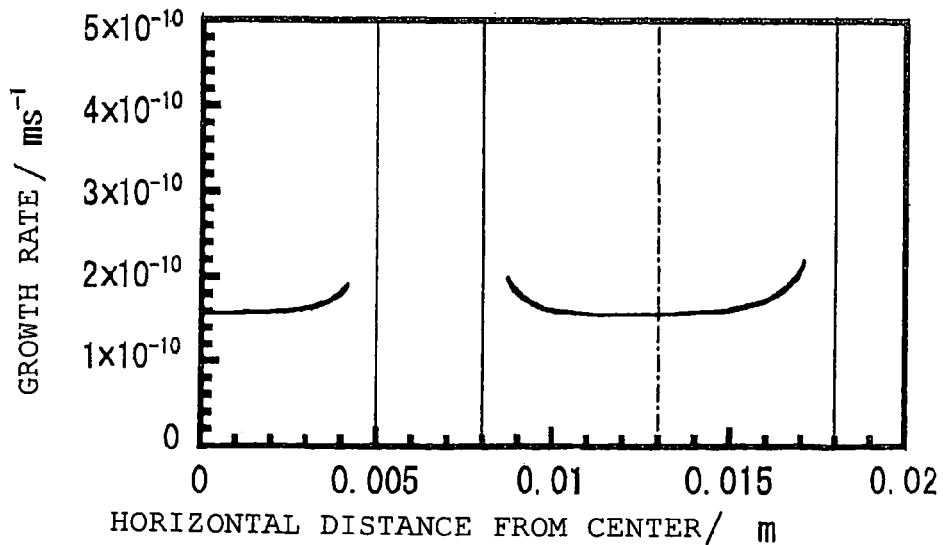
FIG. 7 is a graph showing the relationship between the widthwise position of a superconductor layer formed on a substrate and the growth rate of the crystal of the superconductor layer, this superconductor layer having been manufactured by a method of manufacturing a tape-formed oxide superconductor according to another example of the invention.

FIG. 7 shows the result of Example 3, and the growth rate of the crystal is uniform over the widthwise direction of the superconducting layer as in Example 1. The discrepancy of the growth rates of the crystals in FIG. 7 and Example 1 (FIG. 6) depends upon the difference of the supply rates (flow velocities) of the reactive gas.

The invention permits to quickly manufacture a tape-formed oxide superconductor which is large in area and elongate in shape. Especially, the invention is applicable to the manufacture of a tape-formed oxide superconductor of excellent characteristics by organometallic salt coating and thermodecomposition (MOD).

The invention claimed is:

1. A method of manufacturing an oxide superconductor tape, comprising:
   coating a surface of a tape-shaped substrate with a mixture of a metalorganic acid salts containing elements which constitute an RE123-type superconductor, wherein: "RE" denotes at least one element selected from the group consisting of La, Nd, Sm, Eu, Gd, Dy, Ho, Er, Tm, Yb, Lu and Y, and then calcining the coating to form a film body as a superconductor preform on the surface of the tape-shaped substrate;

continuously moving the substrate through an elongated heating zone and along a travel path defining an axis;

supplying a reactive gas flow vertically to impinge on a film surface of the film body in the heating zone, wherein the reactive gas is supplied at a feed position defined by a linear array of a plurality of gas supply ports spaced widthwise of the film surface, and to then move widthwise across the film surface, perpendicular to the axis and toward and across edges at widthwise opposing sides of the film surface; and simultaneous with the supplying, discharging the gas, after reaction with the film body to form the superconductor tape, as discharge gas flows parallel to the film surface and through paired gas discharge outlets respectively located on the opposing sides of the film surface, wherein the reactive gas flow and the discharge gas flows are in parallel with a plane perpendicular to the axis.

2. A method of manufacturing an oxide superconductor tape as defined in claim 1, wherein the reactive gas is supplied at a plurality of feed positions, the plural feed positions being axially-spaced along the axis, while the gas after the reaction is discharged through a plurality of the paired gas discharge outlets, the pairs of gas discharge outlets being axially spaced along the film at positions respectively corresponding to the axially spaced feed positions so that the linear array of gas supply ports is paired with a pair of gas discharge ports on opposing sides of the film surface.

3. A method of manufacturing an oxide superconductor tape as defined in claim 1, wherein the substrate, carrying a film body on each of opposing surfaces, is extended between a pair of reels disposed within the heating zone, with at least one turn lying in touch with each of the reels and wherein the reactive gas is supplied vertically onto each of respective opposing film surfaces traveling between the reels.

4. A method of manufacturing an oxide superconductor tape as defined in claim 1 wherein the reactive gas flow and the discharge gas flows form, in combination, a gas flow in the form of an inverted T.

5. A method of manufacturing oxide superconductor tape as defined in claim 2 wherein, at each axially spaced feed position, the reactive gas flow and the discharge gas flows, in combination, form a gas flow in the shape of an inverted T.

* * * * *

UNITED STATES PATENT AND TRADEMARK OFFICE
CERTIFICATE OF CORRECTION

PATENT NO. : 8,124,171 B2
APPLICATION NO. : 11/385742
DATED : February 28, 2012
INVENTOR(S) : Yuji Aoki et al.

It is certified that error appears in the above-identified patent and that said Letters Patent is hereby corrected as shown below:

Title Page, Item (73) Assignee: should read as follows:

International Superconductivity Technology Center, The Juridical Foundation, Tokyo (JP); SWCC Showa Cable Systems Co., Ltd., Tokyo (JP) and --Fujikura Ltd., Tokyo (JP)--

Signed and Sealed this
Third Day of July, 2012

David J. Kappos
*Director of the United States Patent and Trademark Office*